US010772233B2

(12) United States Patent
Lu et al.

(10) Patent No.: US 10,772,233 B2
(45) Date of Patent: Sep. 8, 2020

(54) SERVER RAIL AND SERVER RACK MOUNTING STRUCTURE

(71) Applicant: Gslide Corporation, New Taipei (TW)

(72) Inventors: Chun-Min Lu, New Taipei (TW); Yao-Hsien Han, New Taipei (TW)

(73) Assignee: Gslide Corporation, New Taipei (TW)

( * ) Notice: Subject to any disclaimer, the term of this patent is extended or adjusted under 35 U.S.C. 154(b) by 0 days.

(21) Appl. No.: 16/428,304

(22) Filed: May 31, 2019

(65) Prior Publication Data
US 2019/0373759 A1 Dec. 5, 2019

(51) Int. Cl.
H02B 1/01 (2006.01)
H05K 7/18 (2006.01)
H05K 5/02 (2006.01)

(52) U.S. Cl.
CPC ............ H05K 7/183 (2013.01); H05K 5/0204 (2013.01)

(58) Field of Classification Search
USPC ...................... 361/825; 211/183; 248/220.21
See application file for complete search history.

(56) References Cited

U.S. PATENT DOCUMENTS

| 7,703,734 | B2 | 4/2010 | Chen et al. |
| 8,602,255 | B2 | 12/2013 | Lin et al. |
| 9,125,489 | B2 * | 9/2015 | Chen ................ A47B 88/43 |
| 9,148,976 | B2 * | 9/2015 | Fan .................. H05K 7/1489 |
| 9,370,120 | B2 | 6/2016 | Chen et al. |
| 9,377,049 | B2 | 6/2016 | Hwang |
| 9,480,183 | B2 | 10/2016 | Chen et al. |
| 9,670,956 | B2 | 6/2017 | Judge |
| 9,801,467 | B2 | 10/2017 | Chen et al. |
| 9,854,908 | B1 | 1/2018 | Tang |
| 9,854,911 | B1 | 1/2018 | Chang |

(Continued)

FOREIGN PATENT DOCUMENTS

| TW | I305138 | 5/2008 |
| TW | M427756 | 4/2012 |

(Continued)

OTHER PUBLICATIONS

Commonly-owned and co-pending U.S. Appl. No. 16/149,593, filed Oct. 2, 2018.

(Continued)

*Primary Examiner* — Hung S. Bui
(74) *Attorney, Agent, or Firm* — Gardner, Linn, Burkhart & Ondersma LLP

(57) ABSTRACT

An inner slide rail mounting structure for a two-stage server slide rail includes an outer rail, a front bracket, a rear bracket, an outer rail reinforcement bar and an inner rail. The front bracket is affixed to a front end of a front bracket supplementary rail that is slidably inserted into the outer rail reinforcement bar. The rear end of the front bracket supplementary rail is connected with a spring plate that has one end thereof connected to the outer rail reinforcement bar through a tension spring and an opposite end thereof fixedly connected with an outer rail ejection control plate that has an abutment portion abutted against the outer rail reinforcement bar and a press portion extended from the abutment portion for pressing by the user to release the abutment portion from the outer rail reinforcement bar.

1 Claim, 14 Drawing Sheets

(56) References Cited

U.S. PATENT DOCUMENTS

| | | |
|---|---|---|
| 9,918,404 B1 | 3/2018 | Chen |
| 10,051,759 B1 | 8/2018 | Chen |
| 2003/0111436 A1 | 6/2003 | Basinger et al. |
| 2009/0166485 A1* | 7/2009 | Chen ................. A47B 88/43 248/200 |
| 2009/0261699 A1 | 10/2009 | Yu et al. |
| 2010/0072153 A1* | 3/2010 | Chen ................. H05K 7/1421 211/183 |
| 2011/0135224 A1 | 6/2011 | Chen et al. |
| 2011/0192946 A1 | 8/2011 | Yu et al. |
| 2011/0240580 A1 | 10/2011 | Yu et al. |
| 2012/0193489 A1 | 8/2012 | Yu et al. |
| 2014/0363108 A1* | 12/2014 | Chen ................. A47B 88/43 384/22 |
| 2017/0303426 A1* | 10/2017 | Chen ................. A47B 96/07 |
| 2018/0098626 A1 | 4/2018 | Chen et al. |
| 2018/0125234 A1* | 5/2018 | Chen ................. H05K 7/1489 |

FOREIGN PATENT DOCUMENTS

| | | |
|---|---|---|
| TW | I517807 | 3/2014 |
| TW | I489931 | 6/2015 |
| TW | M509508 | 9/2015 |
| TW | M516294 | 1/2016 |
| TW | I573518 | 3/2017 |
| TW | I589214 | 4/2017 |
| TW | I608780 | 12/2017 |

OTHER PUBLICATIONS

Commonly-owned and co-pending U.S. Appl. No. 16/149,833, filed Oct. 2, 2018.

* cited by examiner

SERVER RAIL AND SERVER RACK MOUNTING STRUCTURE

FIELD OF THE INVENTION

The present invention relates to server sliding rail technology and, more particularly, to an inner slide rail mounting structure for a two-stage server slide rail.

BACKGROUND OF THE INVENTION

As FIG. 1 illustrates, when a two-stage server slide rail 9 is used to mount a server box 40' in a server rack 4', the outer rail 91 is affixed to the server rack 4', then the inner rail (not shown) is affixed to the server box 40', and then the server box 40' is inserted into the server rack 4' to put the inner rail into the outer rail 91. However, if there are server boxes 40' already mounted in the server rack 4' at different elevations, it will be difficult to mount another server box 40' in the space 400' between the installed server boxes 40'. When mounting another server box 40' in the space 400' between the installed server boxes 40', the user's view angle will be blocked by the installed server boxes 40' so that the user cannot accurately align the inner rail with the mating outer rail for allowing insertion of another server box 40' into the space 400'.

Further, Taiwan Patent I589214 discloses a detachable inner rail mounting structure for server slide rail, which discloses mounting and dismounting techniques of the inner rail of a server slide rail.

SUMMARY OF THE INVENTION

The present invention provides an inner slide rail mounting structure for a two-stage server slide rail, which enables an outer rail to be ejected out of the front side of the server rack, that is configured for mounting of an inner rail, simply through a pressing action on an outer rail ejection control plate.

Optionally, the inner slide rail mounting structure for a two-stage server slide rail can be operated with one hand, making the operation easier and more convenient.

According to one form of the present invention, an inner slide rail mounting structure for a two-stage server slide rail includes an outer rail, a front bracket, a rear bracket, an outer rail reinforcement bar and an inner rail. The front bracket is affixed to a front end of a front bracket supplementary rail using at least one first fastening member. The front bracket supplementary rail has an opposing rear end thereof axially slidably inserted into a longitudinal sliding groove of the outer rail reinforcement bar so that the outer rail reinforcement bar is movable back and forth relative to the front bracket supplementary rail. The rear end of the front bracket supplementary rail is fixedly connected with a part of a spring plate using at least one second fastening member. The spring plate has one end thereof connected with one end of at least one tension spring. The at least one tension spring has an opposite end thereof connected to a front part of an elongated base wall of the outer rail reinforcement bar. The spring plate has an opposite end thereof fixedly connected with an outer rail ejection control plate using at least one third fastening member. The outer rail ejection control plate has an abutment portion abutted against a front end of a top wall of the outer rail reinforcement bar and a press portion extended from the abutment portion for pressing by the user to release the abutment portion from the front end of the top wall of the outer rail reinforcement bar for allowing the outer rail reinforcement bar to be pulled outwardly relative to the front bracket supplementary rail by the at least one tension spring to carry the outer rail out of the server rack for the mounting of the inner rail.

These and other objects, advantages and features of the invention will become apparent upon review of the following specification in conjunct ion with the drawings.

DESCRIPTION OF THE PREFERRED EMBODIMENTS

Figure 1:
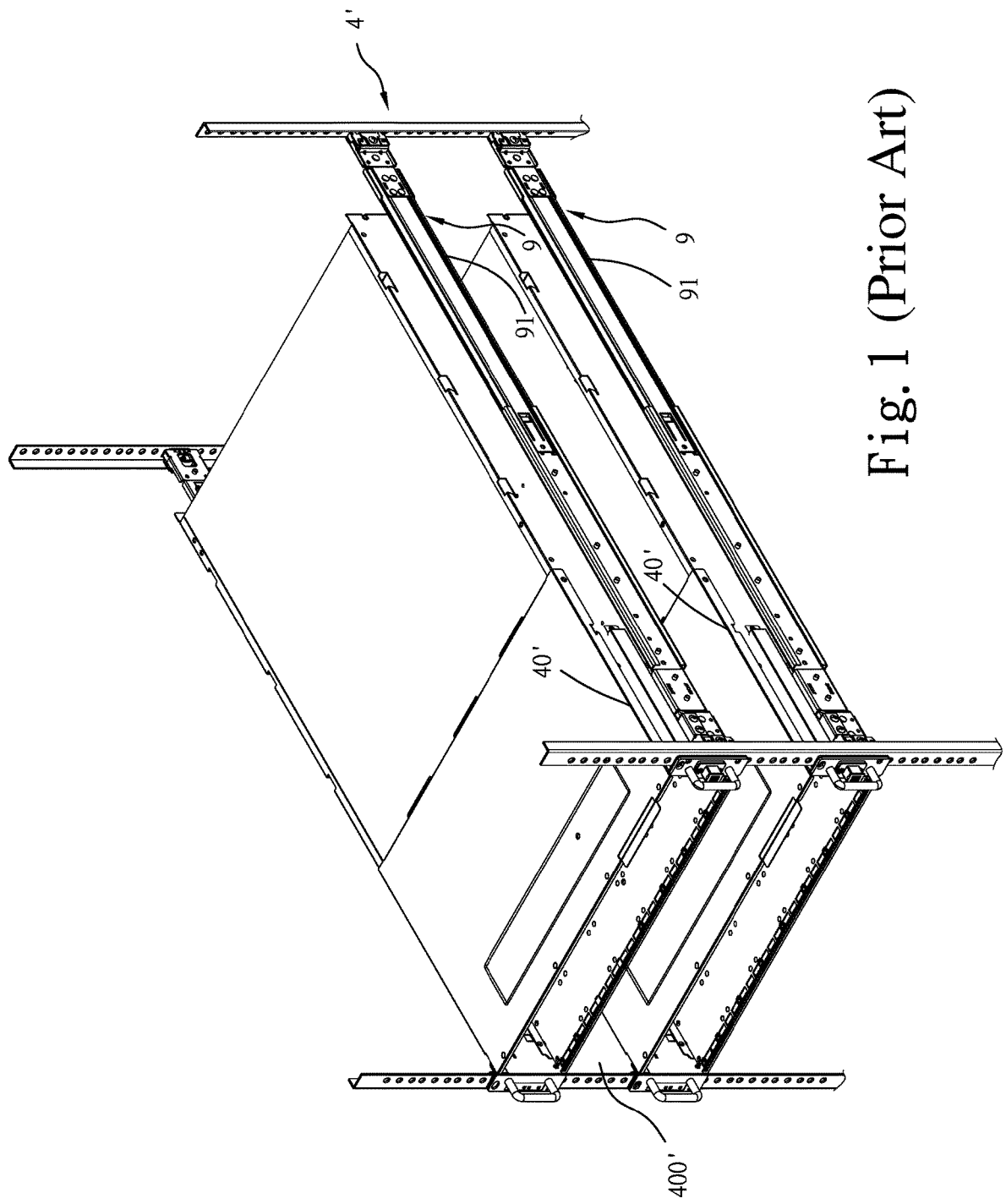
FIG. 1 is a top perspective view of two-stage server rails mounted in a server rack according to the prior art.
Figure 2:
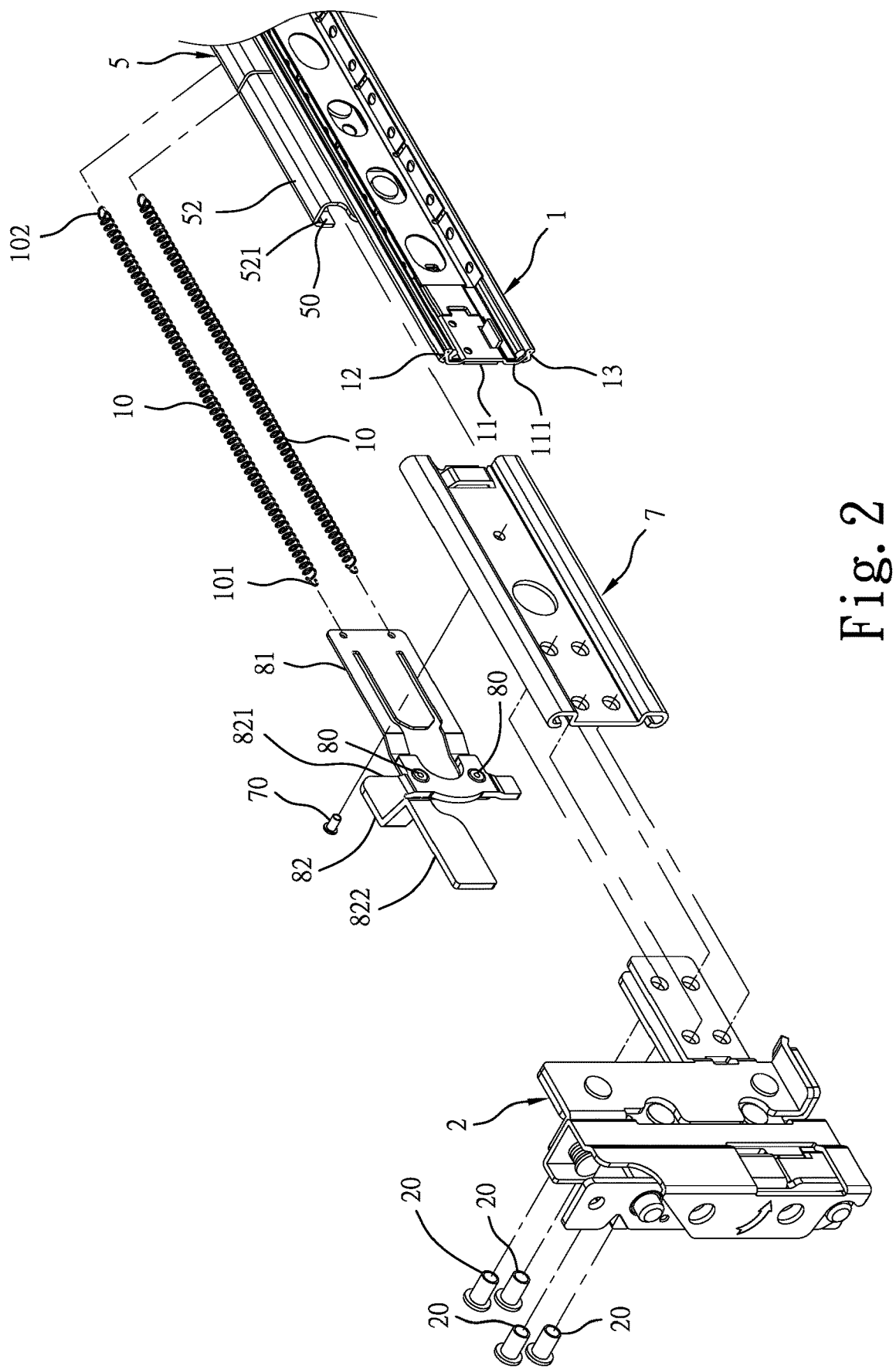
FIG. 2 is an exploded perspective view of an inner slide rail mounting structure for two-stage server slide rail in accordance with the present invention.
Figure 3:
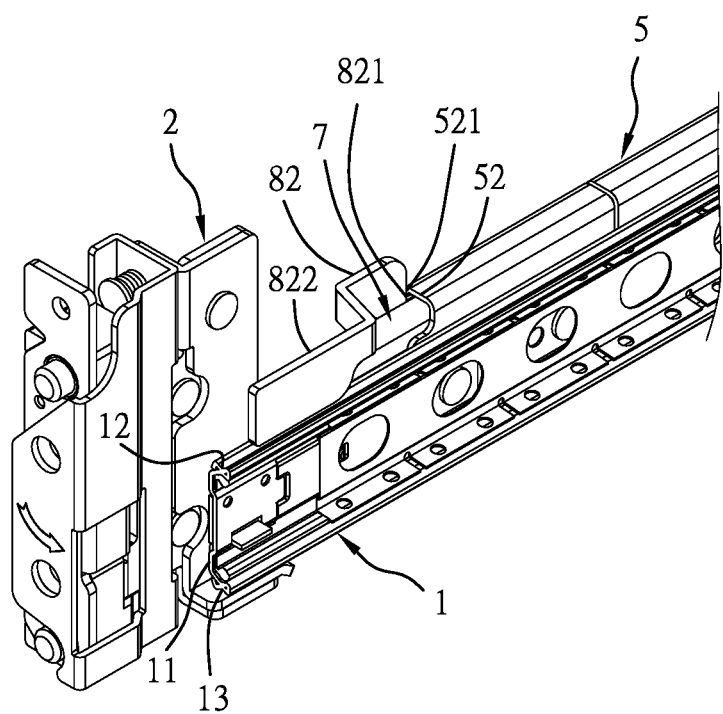
FIG. 3 is a perspective view of an assembled configuration of the outer rail, front bracket supplementary rail, spring plate, tension spring, outer rail ejection control plate and front bracket of the inner rail mounting structure for the two-stage server slide rail.
Figure 4:
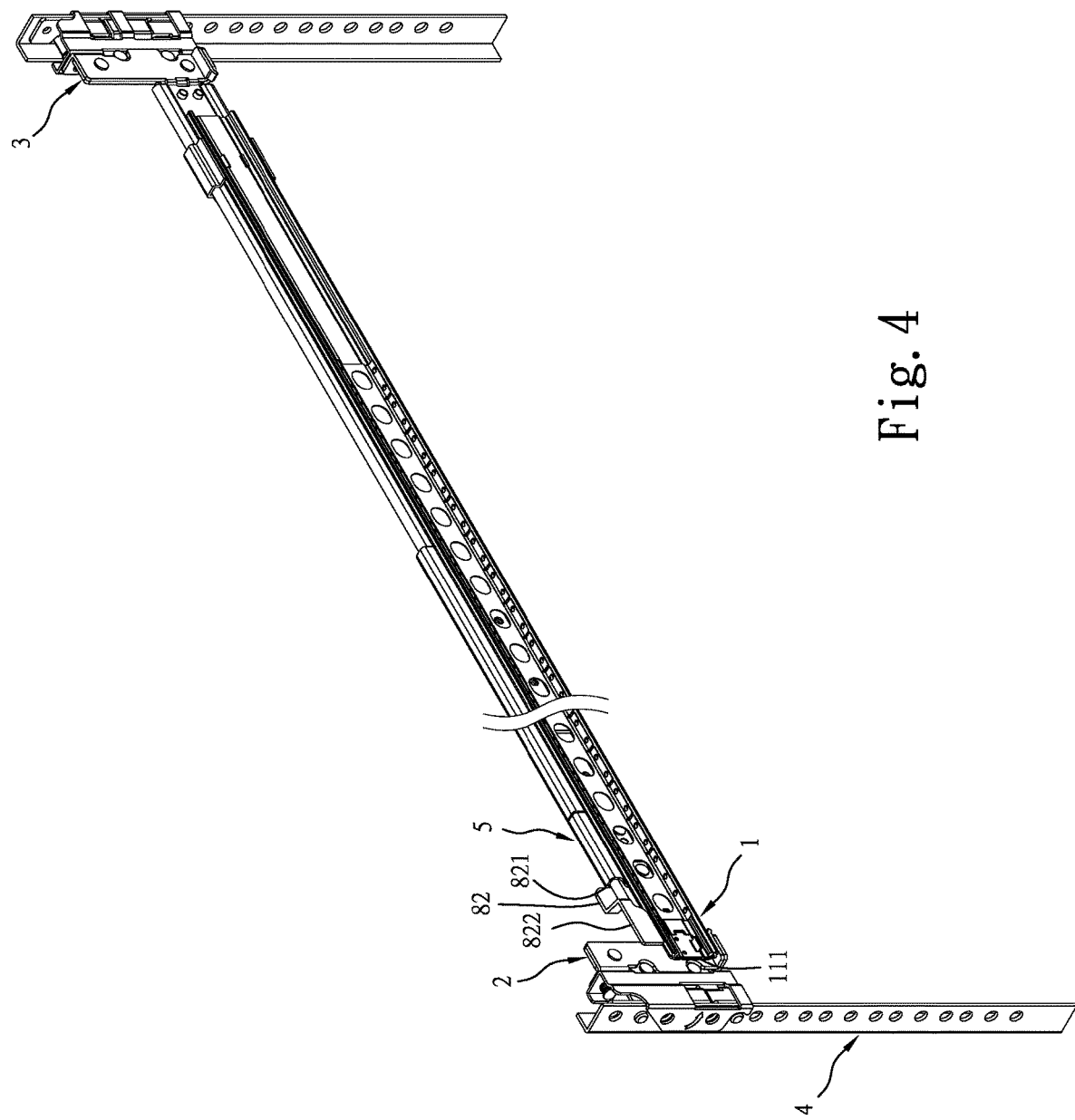
FIG. 4 is a perspective view of the inner rail mounting structure mounted with the front bracket and the rear bracket in the server rack.
Figure 5:
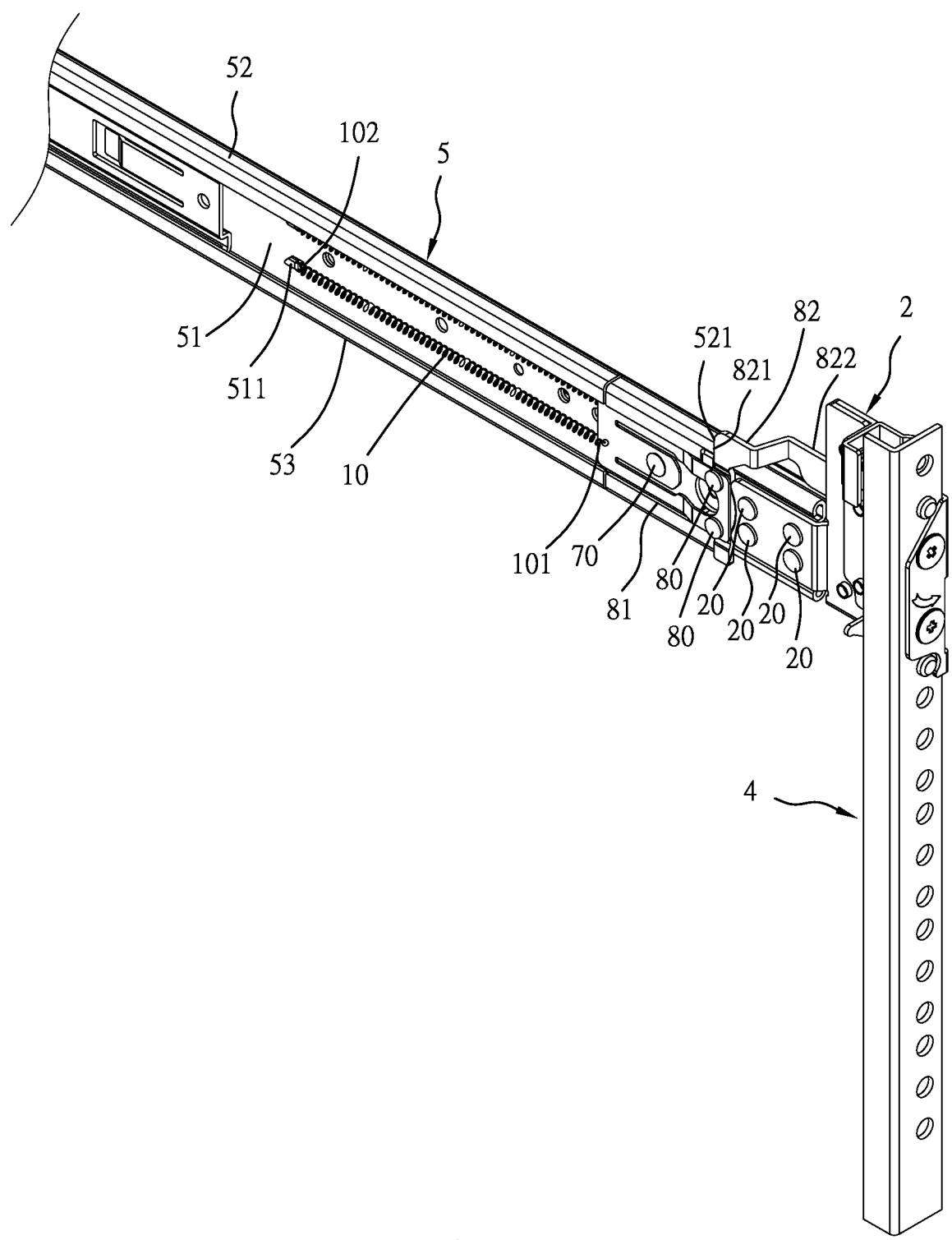
FIG. 5 is an enlarged perspective rear side view of a portion of the inner rail mounting structure of FIG. 4.
Figure 12:
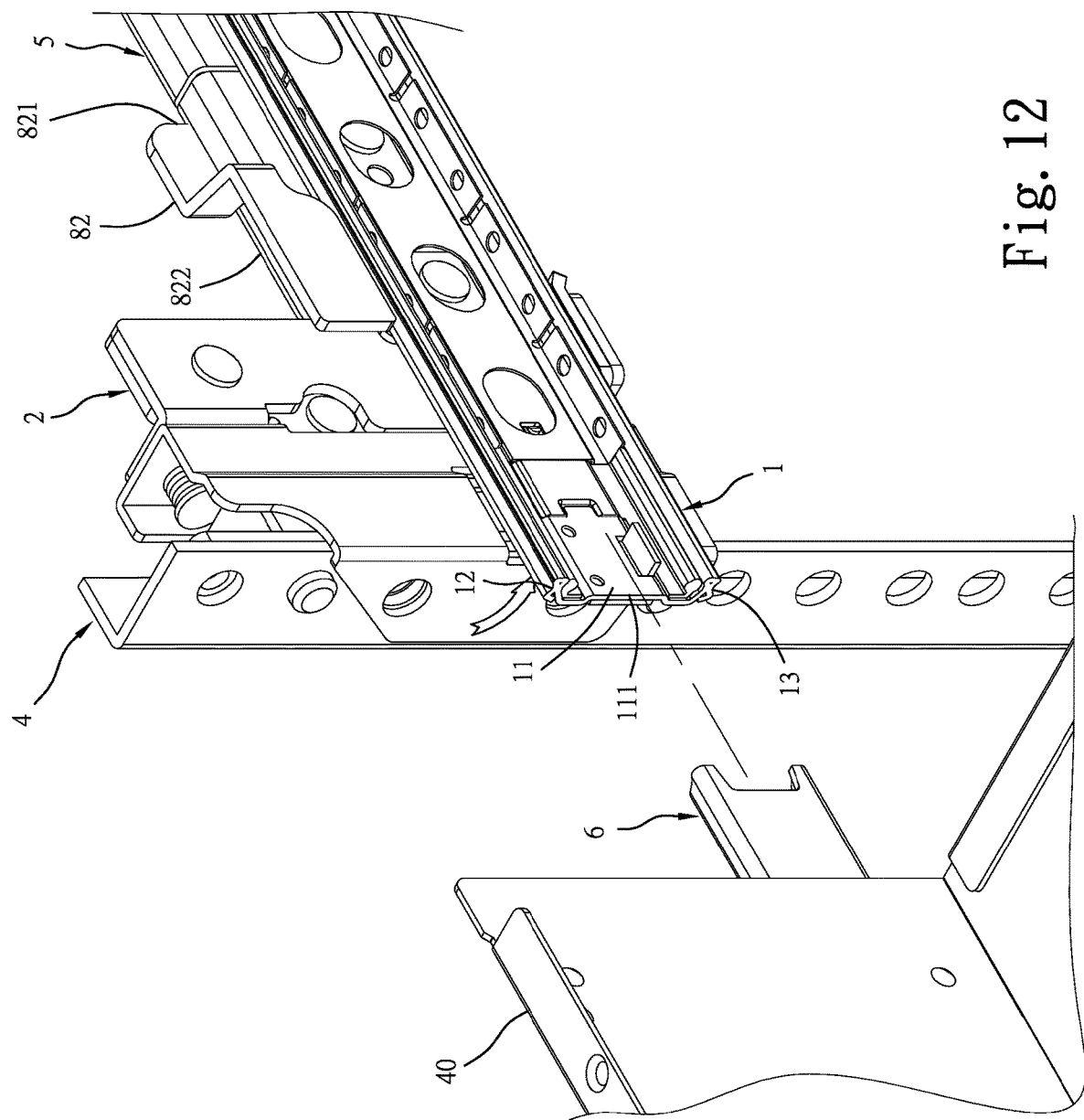
FIG. 12 is a partially exploded perspective view illustrating the outer rail ejection control plate pressed, the outer rail ejected, and the inner rail aimed at the outer rail.
Figure 13:
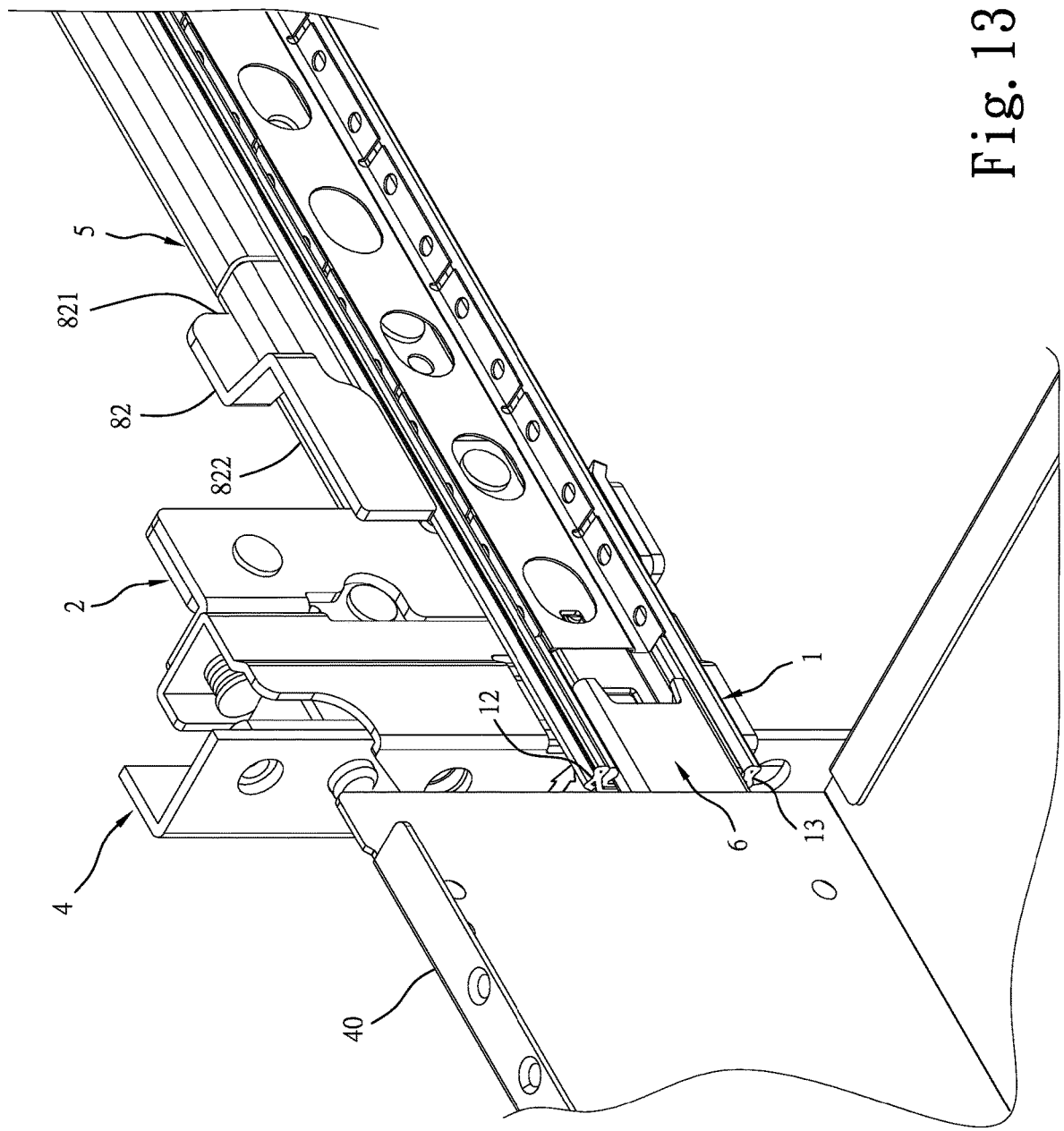
FIG. 13 is another perspective view, generally corresponding to FIG. 12, illustrating the inner rail being inserted into the outer rail.
Figure 14:
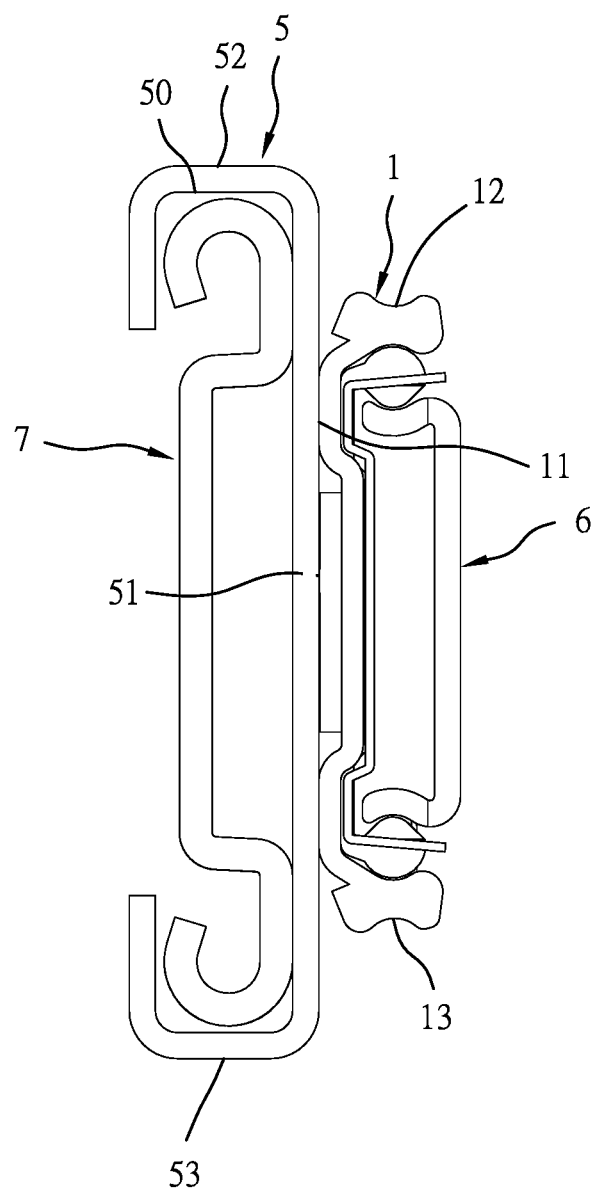
FIG. 14 is an end elevation view of the inner rail, the outer rail, the outer rail reinforcement bar, and the front bracket supplementary rail shown in an assembled configuration.

Referring to FIGS. 2-14, an inner slide rail mounting structure for a two-stage server slide rail includes an outer rail 1 having an elongated base wall 11, and opposing top wall 12 and bottom wall 13, respectively, connected to opposing top and bottom sides of the elongated base wall 11. The inner slide rail structure further includes a front bracket 2 mounted to a server rack 4 with a front end thereof, a rear bracket 3 having a front end thereof fixedly connected with a rear end of the outer rail 1 and a rear end thereof mounted to the server rack 4 (FIG. 4), an outer rail reinforcement bar 5 that has an elongated base wall 51 affixed to a back side of the elongated base wall 11 of the outer rail 1 and opposing top wall 52 and bottom wall 53, respectively. The opposing top and bottom walls 52 and 53 are connected to opposing top and bottom sides of the elongated base wall 51 and define with the elongated base wall 51 a longitudinal sliding groove 50 (FIGS. 2 and 14). The inner slide rail structure additionally includes an inner rail 6 affixed to a server box 40 (FIGS. 12 and 13) and mounted in the outer rail 1 such that the inner rail 6 is axially slidable in and out of the outer rail 1 (FIGS. 12-14).

Figure 6:
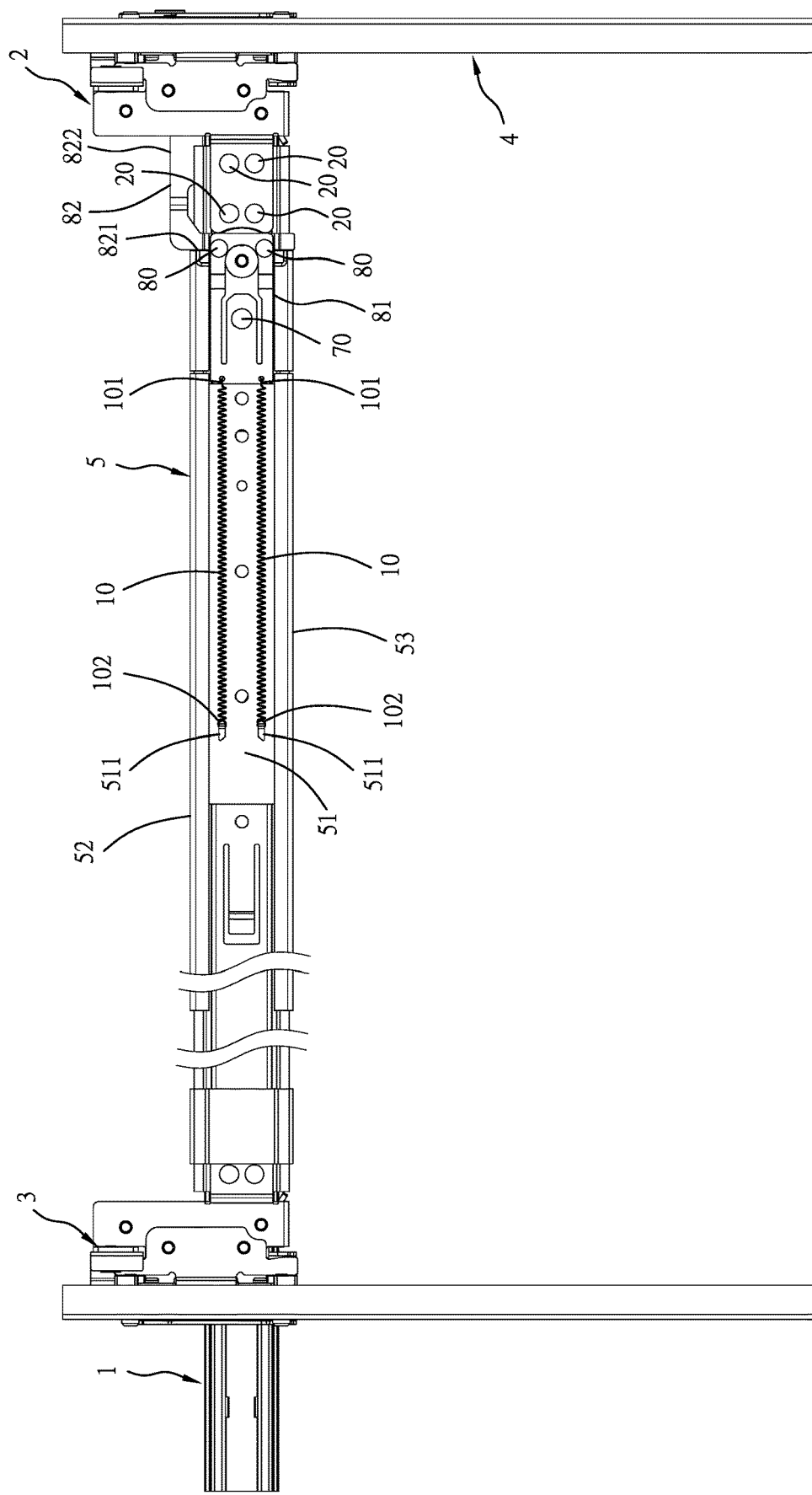
FIG. 6 is a side elevation view of the inner rail mounting structure mounted with the front bracket and the rear bracket in the server rack of FIG. 4.
Figure 7:
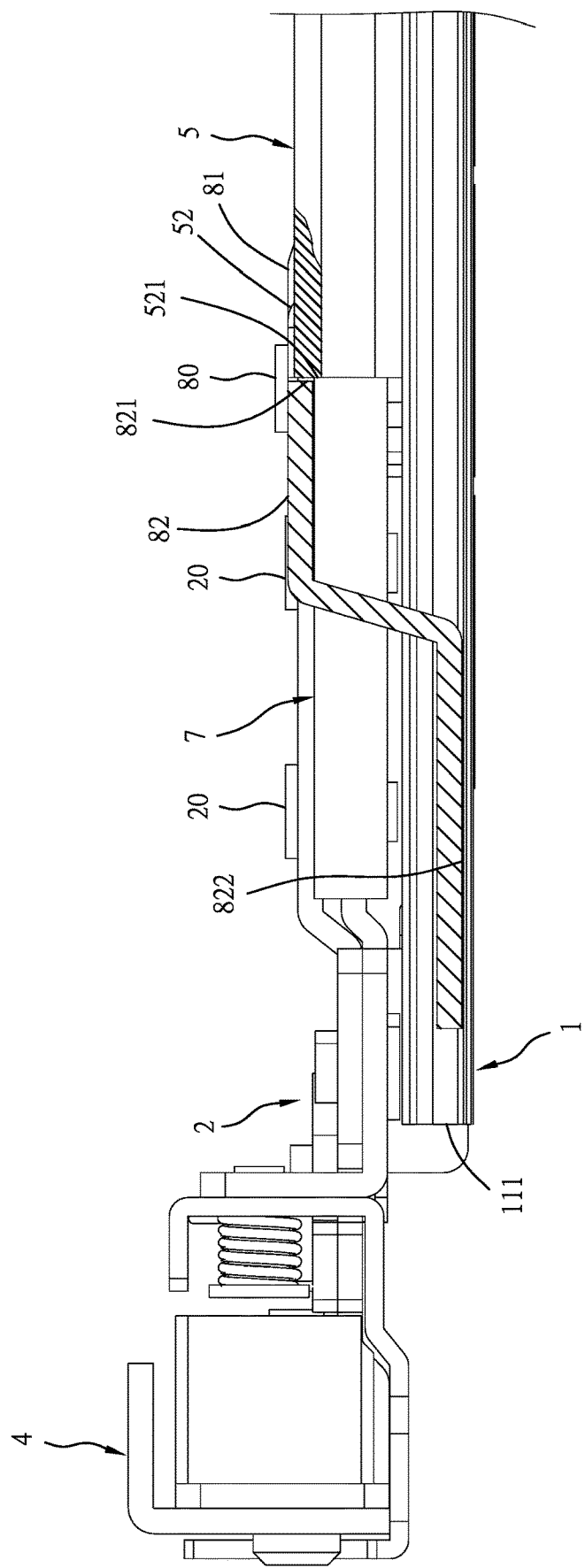
FIG. 7 is a sectional top view of a portion of FIG. 4, illustrating the outer rail ejection control plate.
Figure 8:
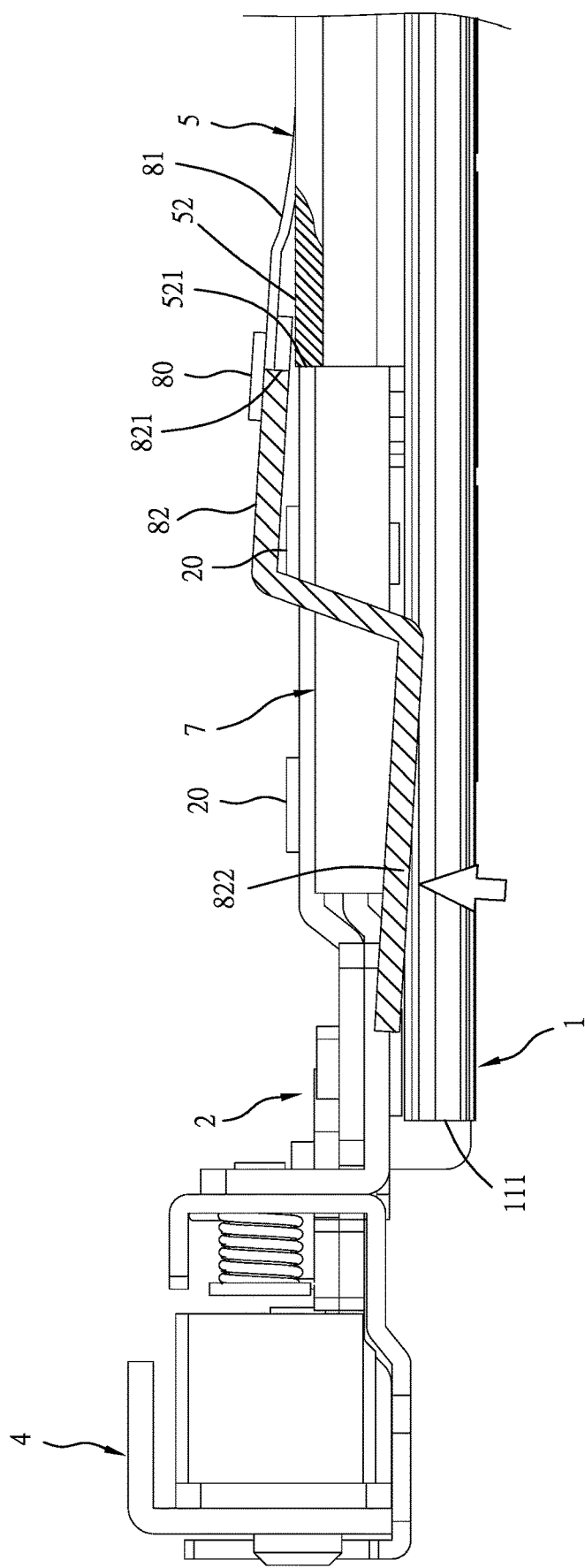
FIG. 8 is another sectional top view, generally corresponding to FIG. 7, illustrating the outer rail ejection control plate pressed.
Figure 9:
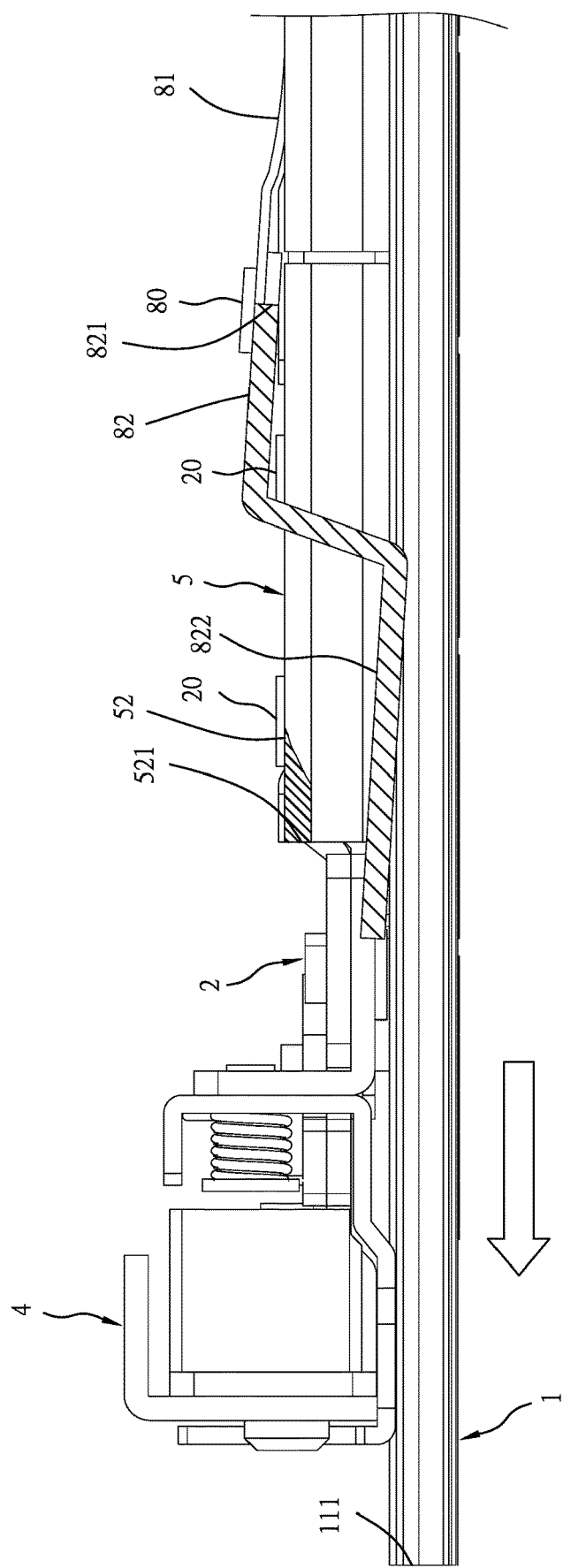
FIG. 9 is another sectional top view, generally corresponding to FIG. 8, illustrating the outer rail ejection control plate pressed and the outer rail ejected.
Figure 10:
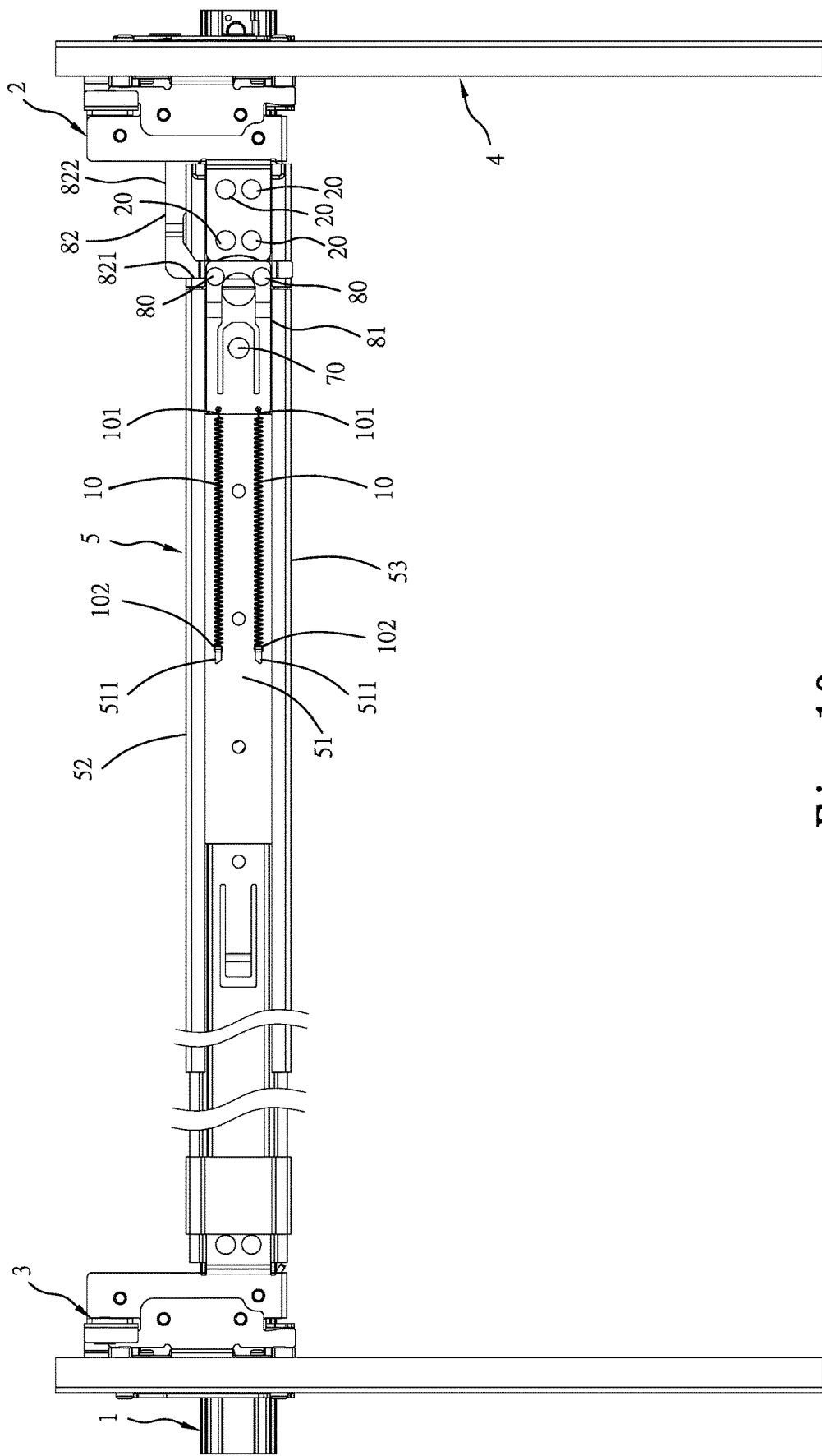
FIG. 10 is a side elevation view, generally corresponding to FIG. 6, illustrating the outer rail ejection control plate pressed and the outer rail ejected.
Figure 11:
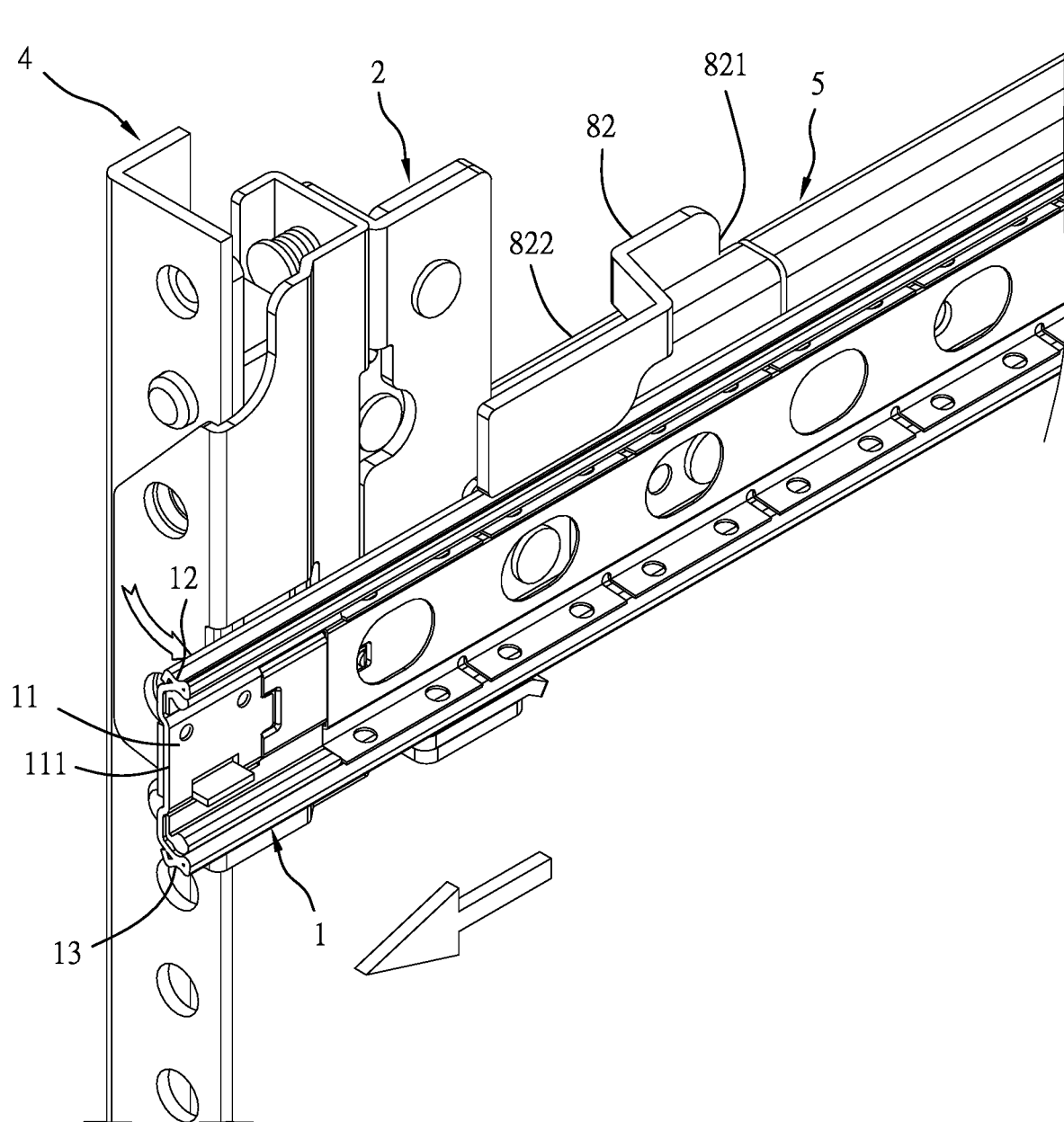
FIG. 11 is a perspective view, generally corresponding to FIG. 3, illustrating the outer rail ejection control plate pressed and the outer rail ejected.

The front bracket 2 is affixed to a front end of a front bracket supplementary rail 7 using at least one first fastening member 20 (FIG. 2). The front bracket supplementary rail 7 has an opposing rear end that is axially slidably inserted into the longitudinal sliding groove 50 of the outer rail reinforcement bar 5 (FIGS. 2 and 14) so that the outer rail reinforcement bar 5 can be moved back and forth relative to the front bracket supplementary rail 7. Further, the rear end of the front bracket supplementary rail 7 is fixedly connected with a part of a spring plate 81 using at least one second fastening member 70 (FIG. 2). The spring plate 81 has one end thereof connected with one end 101 of at least one tension spring 10 (FIGS. 2, 6 and 10). The at least one tension spring 10 has an opposite end 102 thereof connected to a front part 511 of the elongated base wall 51 of the outer rail reinforcement bar 5 (FIGS. 2, 6 and 10). An opposite end of the spring plate 81 is fixedly connected with an outer rail ejection control plate 82 using at least one third fastening member 80. The outer rail ejection control plate 82 has an abutment portion 821 for abutting against a front end 521 of the top wall 52 of the outer rail reinforcement bar 5 (FIGS. 2, 3, 5 and 7), and a press portion 822 extended from the abutment portion 821 (FIGS. 2 and 3) for pressing by the user to release the abutment portion 821 from the front end 521 of the top wall 52 of the outer rail reinforcement bar 5. Hence, the press portion 822 can be actuated to allow the outer rail reinforcement bar 5 to be pulled outwardly, relative to the front bracket supplementary rail 7, by the at least one tension spring 10 to carry the outer rail 1 outward, making the front end 111 of the outer rail 1 protrude beyond the front side of the server rack 4 (FIGS. 9-12) for mounting of the inner rail 6 into the outer rail 1 (FIG. 13). After insertion of the inner rail 6 into the outer rail 1, the user can push the inner rail 6 and the server box 40 into the inside of the server rack 4 with one single hand.

Mounting the inner rail 6 in the outer rail 1 is accomplished by pressing the press portion 822 of the outer rail ejection control plate 82 to release the abutment portion 821 from the front end 521 of the top wall 52 of the outer rail reinforcement bar 5. This allows the outer rail reinforcement bar 5 to be pulled outwardly, relative to the front bracket supplementary rail 7, by the at least one tension spring 10 to carry the outer rail 1 outward, thereby causing the front end 111 of the outer rail 1 to protrude beyond the front side of the server rack 4 (FIGS. 9-12) for mounting of the inner rail 6 into the outer rail 1 (FIG. 13). This operation can be performed easily with one hand.

Although a particular embodiment of the present invention has been described in detail for purposes of illustration, various modifications and enhancements may be made without departing from the spirit and scope of the invention. Accordingly, the invention is not to be limited except as by the appended claims, as interpreted according to the principles of patent law including the doctrine of equivalents.

The invention claimed is:

1. An inner slide rail mounting structure for a two-stage server slide rail comprises:
    an outer rail comprising an elongated base wall and opposing top and bottom walls connected to respective opposing top and bottom sides of said elongated base wall of said outer rail;
    a front bracket mounted to a server rack;
    a rear bracket having a front end thereof fixedly connected with a rear end of said outer rail, wherein a front end of said outer rail is mounted to the server rack;
    an outer rail reinforcement bar comprising (i) an elongated base wall affixed to a back side of said elongated base wall of said outer rail and (ii) opposing top and bottom walls connected to respective opposing top and bottom sides of said elongated base wall of said outer rail reinforcement bar, wherein said opposing top and bottom walls and said elongated base wall of said outer rail reinforcement bar cooperate to define a longitudinal sliding groove; and
    an inner rail affixed to a server box and mounted in said outer rail and axially slidable in and out of said outer rail;
    a front bracket supplementary rail comprising a front end and an opposing rear end, wherein said front end of said front bracket supplementary rail is affixed to said front bracket using at least one first fastening member, and wherein said opposing rear end of said front bracket supplementary rail is axially slidably inserted into said longitudinal sliding groove of said outer rail reinforcement bar so that said outer rail reinforcement bar is movable back and forth relative to said front bracket supplementary rail;
    a spring plate comprising a first end and an opposing second end, wherein a part of said spring plate is fixedly connected to said opposing rear end of said front bracket supplementary rail using at least one second fastening member;
    at least one tension spring comprising a first end and an opposing second end, wherein said first end of said at least one tension spring is connected to said opposing second end of said spring plate, and wherein said opposing second end of said at least one tension spring is connected to a front part of said elongated base wall of said outer rail reinforcement bar; and
    an outer rail ejection control plate comprising an abutment portion and a press portion, wherein said outer rail ejection control plate is fixedly connected to said first end of said spring plate using at least one third fastening member;
    wherein said abutment portion of said outer rail ejection control plate is abutted against a front end of said top wall of said outer rail reinforcement bar; and
    wherein said press portion is extended from said abutment portion for pressing by a user to release said abutment portion from said front end of said top wall of said outer rail reinforcement bar to allow said outer rail reinforcement bar to be pulled outwardly relative to said front bracket supplementary rail by said at least one tension spring to carry said outer rail out of the server rack for the mounting of said inner rail.

* * * * *